US010812082B1

(12) United States Patent
Manohar et al.

(10) Patent No.: US 10,812,082 B1
(45) Date of Patent: Oct. 20, 2020

(54) BI-DIRECTIONAL SINGLE SUPPLY LEVEL SHIFTER CIRCUIT

(71) Applicant: Apple Inc., Cupertino, CA (US)

(72) Inventors: Sujan K. Manohar, Austin, TX (US); Nathan F. Hanagami, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/586,146

(22) Filed: Sep. 27, 2019

(51) Int. Cl.
*H03L 5/00* (2006.01)
*H03K 19/0185* (2006.01)
*H03K 17/687* (2006.01)
*H03K 19/017* (2006.01)

(52) U.S. Cl.
CPC . *H03K 19/018514* (2013.01); *H03K 17/6871* (2013.01); *H03K 19/01714* (2013.01); *H03K 2217/0081* (2013.01)

(58) Field of Classification Search
CPC ..... H03K 19/018514; H03K 19/01714; H03K 17/6871; H03K 2217/0081
USPC ...................................... 327/333; 326/80, 81
See application file for complete search history.

(56) References Cited

U.S. PATENT DOCUMENTS

| 7,199,617 | B1* | 4/2007 | Schrom .......... H03K 19/018528 326/68 |
| 7,750,717 | B2 | 7/2010 | Ali et al. |
| 7,816,969 | B2* | 10/2010 | Yoo ........................ H03K 3/012 326/80 |
| 7,880,526 | B2* | 2/2011 | Acharya .......... H03K 3/356113 326/63 |
| 8,446,188 | B2* | 5/2013 | Bellur .................... H03K 17/22 327/143 |
| 9,331,516 | B2* | 5/2016 | Goyal .................... H02J 7/045 |
| 9,438,239 | B2 | 9/2016 | Gao |
| 9,484,922 | B2 | 11/2016 | Malkov |
| 9,979,399 | B2* | 5/2018 | Chen .............. H03K 19/018528 |
| 10,447,269 | B1* | 10/2019 | Zhang ............ H03K 19/018528 |
| 2009/0231015 | A1* | 9/2009 | Tobita .............. H03K 3/356113 327/333 |
| 2010/0019825 | A1* | 1/2010 | Ali .................. H03K 19/018521 327/333 |

OTHER PUBLICATIONS

Sujan K. Manohar, et al., "Bidirectional Single-Supply Level Shifter with Wide Voltage Range for Efficient Power Management," 2012 25th International Conference on VLSI Design, pp. 125-130.

* cited by examiner

*Primary Examiner* — Ryan Jager
(74) *Attorney, Agent, or Firm* — Kowert, Hood, Munyon, Rankin & Goetzel, P.C.

(57) ABSTRACT

A level shifter circuit included in a computer system may include bootstrap and feedback nodes. The level shifter circuit may discharge the feedback node in response to high-going transition on a received input signal generated using a first power supply signal. The level shifter circuit may also increase a voltage level of the bootstrap node in response to the high-going transition and charge the bootstrap node, in response to the discharge of the feedback node, to a voltage level of a second power supply signal that is different than a voltage level of the first power supply signal. The level shifter circuit may generate an output signal using the voltage levels of the feedback node and the second power supply signal.

17 Claims, 11 Drawing Sheets

BI-DIRECTIONAL SINGLE SUPPLY LEVEL SHIFTER CIRCUIT

BACKGROUND

Technical Field

This disclosure relates to level shifter circuits in computer systems and more particularly to bi-directional level shifter circuits.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

The circuit blocks in a computer system may be fabricated on a common silicon substrate forming a system-on-a-chip or "SoC." Alternatively, a computer system may employ different circuit blocks fabricated on respective substrates and then mounted on a common circuit board, package, or other suitable substrate.

In some cases, the circuit blocks, or portions of a particular circuit block, may be designed to operation using the power supply voltage levels. The use of different power supply voltage levels may be a result of difference in manufacturing technologies, desired performance levels, desired power consumption levels, and the like. Respective voltage ranges of signals transmitted between circuit blocks employing different power supply voltage levels may have to be adjusted to allow a receiving circuit to properly use an incoming signal. For example, a voltage range of signal being transmitted from a circuit block using a power supply voltage level greater than the circuit block receiving the signal may be reduced using a level shift circuit or other suitable circuit.

SUMMARY OF THE EMBODIMENTS

Various embodiments of a level shifter circuit are disclosed. Broadly speaking, a level shifter circuit may include an input circuit, a bootstrap circuit, a feedback circuit, and a driver circuit. The input circuit may be configured to receive an input signal generated using a first power supply signal and discharge a feedback node in response to a high-going transition of the input signal. The bootstrap circuit may be configured to increase a voltage level of a bootstrap node in response to the high-going transition of the input signal. The feedback circuit may be configured to charge the bootstrap node to a voltage level of a second power supply signal in response to a discharge of the feedback node, where the voltage level of the second power supply is different than a voltage level of the first power supply signal. The driver circuit may be configured to generate an output signal using the second power supply signal and the voltage level of the feedback node. In a different embodiment, the level shifter circuit may further include a transient assist circuit configured to source a current to the bootstrap node in response to the discharge of the feedback node,

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

In computer systems, different circuit blocks often employ different power supply voltage levels. In some cases, the different power supply voltages levels for a given circuit block may change over time based on a level of activity of the given circuit block, or other power conservation measures performed by a computer system.

In some cases, signals generated by a circuit block operating using a given power supply signal may be transmitted for consumption by a different block operating using a different power supply signal. When the respective voltage levels of the two power supply signals are not the same, a level shifter circuit may be employed to translate a signal from one power supply domain to another power supply. Such translation of signals can be either translating a signal from given supply domain to a different supply domain with a higher voltage level (referred to as "up shifting"), or translating a signal from the given supply domain to another supply domain with a lower voltage level (referred to as "down shifting"). When level shifter circuits are not employed, the difference between the respective voltage levels of the two power supply signals may result in incorrect detection of data encoded in the signals transmitted by the circuit block and large static current consumption.

Such level shifter circuits often employ both power supply signals, i.e., the source power supply signal and the destination power supply signal, which results in the additional power supply signal wiring within a computer system. To remediate the use of the additional wiring, some computer systems employ single supply level shifters. In a single supply level shifter circuit, only the destination power supply signal is used by the level shifter circuit.

Some single supply level shifter circuits are configured to convert signals between two power domains with a known relationship. These types of single supply level shifter circuits are commonly referred to as uni-directional level shifter circuits. For example, if a single supply level shifter is configured to only convert signals from a first power domain to a second power domain that has a higher voltage level than the first power domain, then the single supply level shifter circuit is said to be uni-directional. This type of limitation can be problematic for some computer systems where the relationships between respective voltage levels of various power domains may be dynamic.

In some computer systems, bi-directional single supply level shifter circuits may be employed. Bi-directional level shifter circuits are configured to translate signals between two power domains regardless of the relationship between the respective voltage levels of the power domains. Such bi-directional single supply level shifter circuits may, however, be physically large and consume static power. Additionally, such bi-directional single supply level shifter circuit may employ devices with different threshold voltages, thereby complicating the design and making it more expensive to manufacture. The embodiments illustrated in the drawings and described below may provide techniques for bi-directional level shifting a signal that do not consume static power or employ devices with multiple threshold voltages, while still maintaining desired performance goals.

Figure 1:
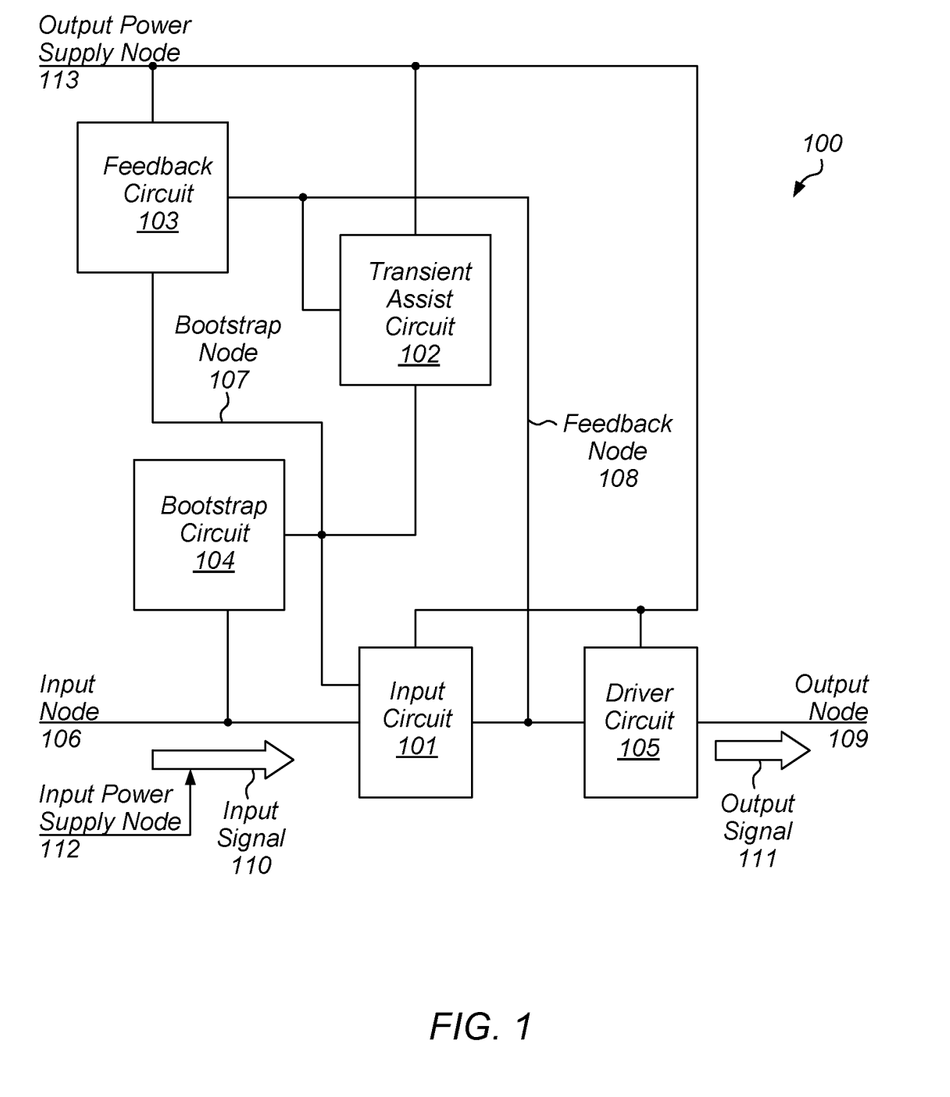
FIG. 1 is a block diagram of an embodiment of a level shifter circuit.

A block diagram of a level shifter circuit is depicted in FIG. 1. As illustrated, level shifter circuit 100 includes input circuit 101, transient assist circuit 102, feedback circuit 103, bootstrap circuit 104, and driver circuit 105.

Input circuit 101 is coupled to input node 106 and feedback node 108, and is configured to receive input signal 110 generated using a voltage level of input power supply node 112. Input circuit 101 is also configured to discharge feedback node 108 in response to a high-going transition of input signal 110. As used herein, a high-going transition of a signal refers to a change in a voltage level of the signal from a first voltage level to a second, higher voltage level. Similarly, as used herein, a low-going transition of a signal refers to a change in the voltage level of the signal from a first voltage level to a second, lower voltage level.

Bootstrap circuit 104 is configured to increase a voltage level of bootstrap node 107 in response to the high-going transition of input signal 110. As described below in more detail, bootstrap circuit 104 may couple a change in the voltage level of input node 106 to bootstrap node 107 using a capacitor or other suitable circuit elements.

Feedback circuit 103 is configured to charge bootstrap node to a voltage level of output power supply node 113 in response to a discharge of feedback node 108. In various embodiments, a voltage level of output power supply node 113 is different than a voltage level of input power supply node 112.

Driver circuit 105 is configured to generate output signal 111 using the voltage level of output power supply node 113 and the voltage level of feedback node 108. As described below in more detail, driver circuit 105 may selectively charge or discharge output node 109 based on the voltage level of feedback node 108 in order to generate output signal 111.

Figure 2:
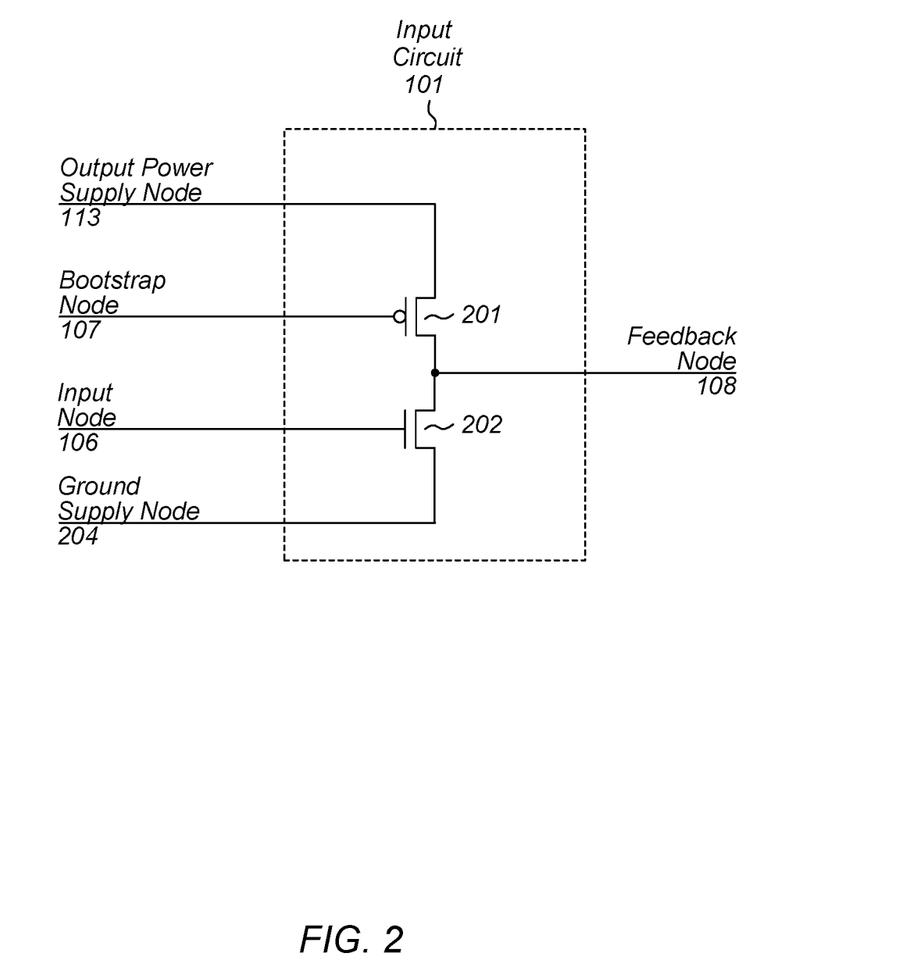
FIG. 2 illustrates a block diagram of an embodiment of an input circuit.

An embodiment of input circuit 101 is depicted in FIG. 2. As illustrated, input circuit 101 includes devices 201 and 202. Device 201 is coupled between output power supply node 113 and feedback node 108, and is controlled, at least in part, by a voltage level of bootstrap node 107. Device 202 is coupled between feedback node 108 and ground supply node 204, and is controlled, at least in part, by a voltage level of input node 106.

Device 201 may, in some embodiments, be a particular embodiment of a p-channel metal-oxide semiconductor field-effect transistor (MOSFET) that is configured to allow current to flow from output power supply node 113 to feedback node 108. For example, when a voltage level of bootstrap node 107 is less than the voltage level of output power supply node 113 by a threshold value, device 201 may activate allowing current to flow from output power supply node 113 to feedback node 108, thereby charging feedback node 108 to a higher voltage level. It is noted that although device 201 is depicted as being a single device, in other embodiments, device 201 may include multiple devices coupled together in parallel.

In some embodiments, device 202 may be a particular embodiment of an n-channel MOSFET or other suitable transconductance device, and may be configured to allow a current to flow from feedback node 108 to ground supply node 204, thereby discharging feedback node 108. For example, when a voltage level of input node 106 is a threshold value about the voltage level of ground supply node 204, device 202 activates and feedback node 108 is discharged. Although device 202 is depicted as a single device, in other embodiments, device 202 may include multiple devices coupled together in parallel.

Figure 3:
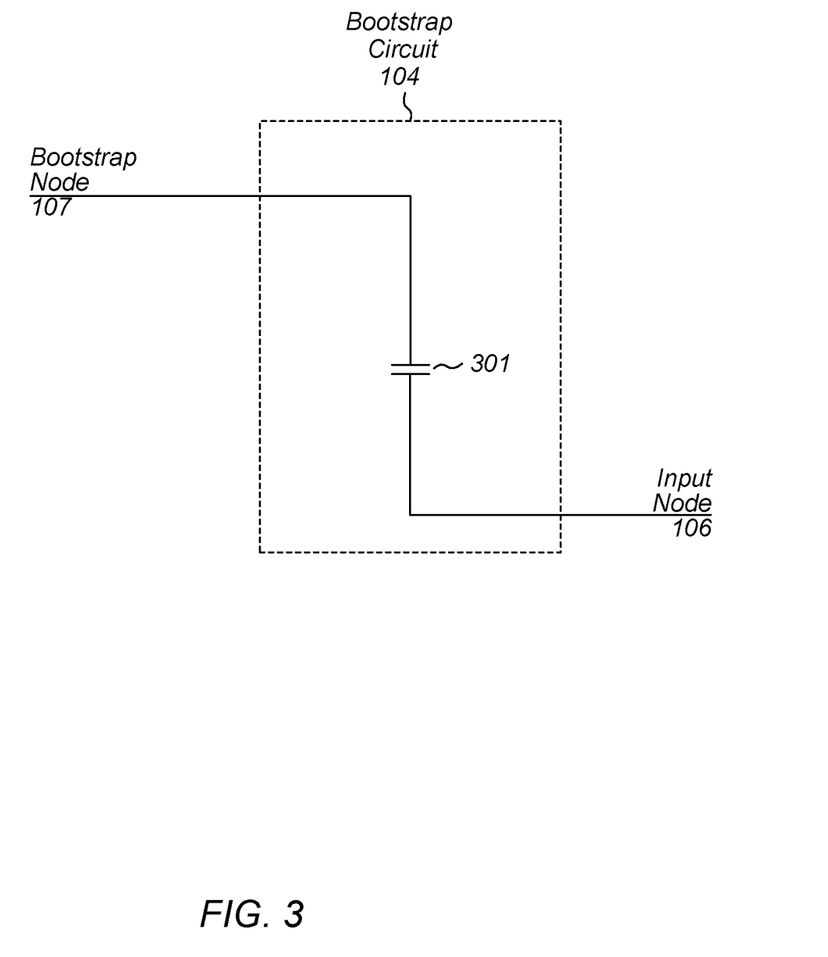
FIG. 3 illustrates a block diagram of a bootstrap circuit.

Turning to FIG. 3, an embodiment of bootstrap circuit 104 is depicted. As illustrated bootstrap circuit 104 includes capacitor 301 coupled between input node 106 and bootstrap node 107.

Capacitor 301 is configured to couple input node 106 to bootstrap node 107. In particular, a change in the voltage level of input node 106 may result in a corresponding change in the voltage level on bootstrap node 107. In various embodiments, a magnitude of the change in the voltage level of bootstrap node 107 resulting from the change in the voltage level of input node 106 may be based, at least in part, on an amount of capacitance associated with capacitor 301. For example, a transition for a high logic level to a low logic level on input node 106 may result in a decrease in a voltage level on bootstrap node 107. As noted below, the change in the voltage level on bootstrap node 107 may be accompanied by a transient assist circuit 102 entering a high impedance mode, in which no current is sourced to bootstrap node 107.

In various embodiments, capacitor 301 may be a metal-oxide-metal (MOM) capacitor structure, metal comb structure, or any other suitable capacitor structure that can be manufactured using a semiconductor manufacturing process. The value of capacitor 301 may be determined, at least in part, by the capacitance of bootstrap node 107. For example, in some cases, the value of capacitor 301 may be selected to be at least 3 to 5 times larger than the capacitance of bootstrap node 107. Although a single capacitor is depicted in the embodiment of FIG. 3, in other embodiments, any suitable number and/or arrangement of capacitors may be employed to achieve a desired capacitance value.

Figure 4:
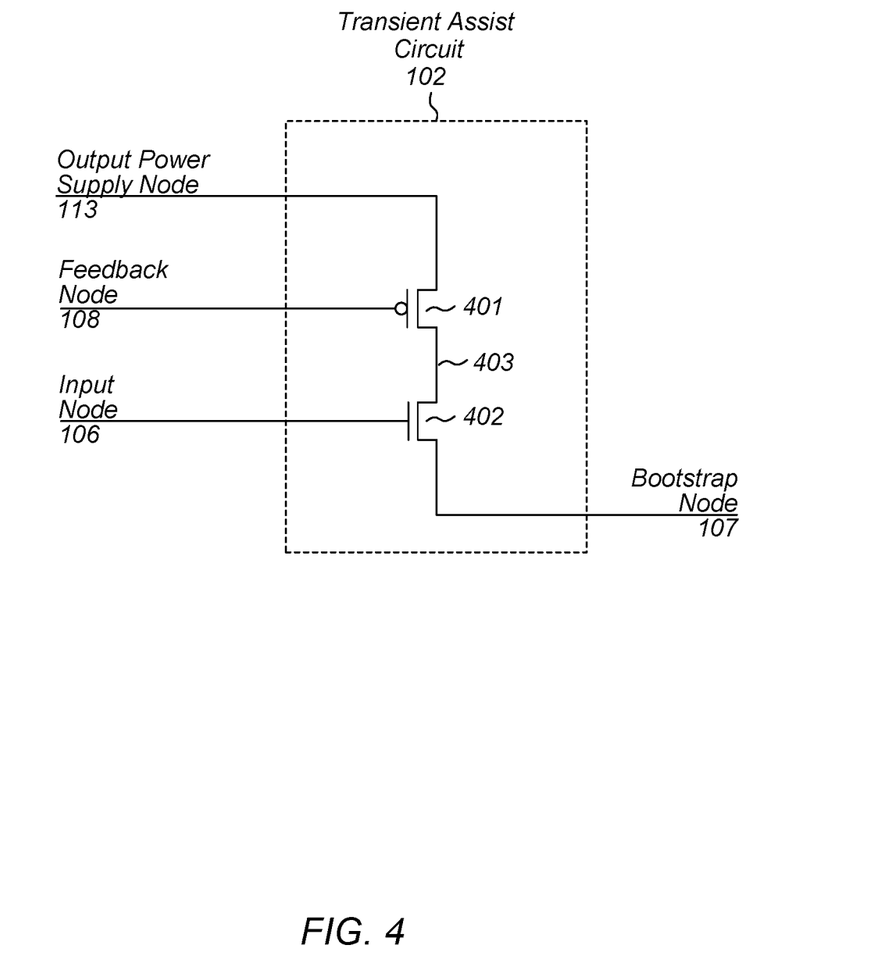
FIG. 4 illustrates a block diagram of a transient assist circuit.

A block diagram of transient assist circuit 102 is depicted in FIG. 4. As illustrated, transient assist circuit 102 includes devices 401 and 402. In various embodiments, device 401 may be a particular embodiment of a p-channel MOSFET, and device 402 may be a particular embodiment of an n-channel MOSFET. Transient assist circuit 102 is configured to source a current to bootstrap node 107 in response to the discharge of the feedback node 108. Additionally, the transient assist circuit 102 is also configured to halt sourcing current to bootstrap node 107 in response to a low-going transition on input signal 110. In some cases, to halt sourcing current to bootstrap node 107, transient assist circuit 102 may enter a high impedance state by deactivating at least one of devices 401 and 402.

Device 401 is coupled between output power supply node 113 and node 403 In various embodiments, device 401 is controlled, at least in part, by a voltage level on feedback node 108. For example, a difference between the voltage level of feedback node 108 and the voltage level of output power supply node 113 may determine an amount of current flowing through device 401.

Device 402 is coupled between node 403 and bootstrap node 107. In various embodiments, device 402 is controlled, at least in part, by a voltage level on input node 106. For example, a difference between the voltage level of input node 106 and the voltage level of bootstrap node 107 may determine an amount of current flowing through device 402.

In response to a high-going transition of input signal 110, device 402 will activate. As described above, the high-going transition of input signal 110 results in input circuit 101 discharging feedback node 108. As feedback node 108 is discharged, device 401 will activate, allowing a current to be sourced from output power supply node 113 to bootstrap node 107. By sourcing such a current to bootstrap node 107, transient assist circuit 102 further increases the voltage level of bootstrap node 107, which started increasing in response to bootstrap circuit 104 coupling the high-going transition of input signal 110 into bootstrap node 107.

When there is a low-going transition on input signal 110, device 402 deactivates, thereby preventing further current from being sourced from output power supply node 113 to bootstrap node 107. By halting the sourcing of current to bootstrap node 107, current from output power supply node 113 to ground supply node 204 (commonly referred to as "shoot through current") may be reduced as feedback circuit 103 begins to discharge bootstrap node as the voltage level of feedback node 108 increases in response to the low-going transition on input signal 110.

Figure 5:
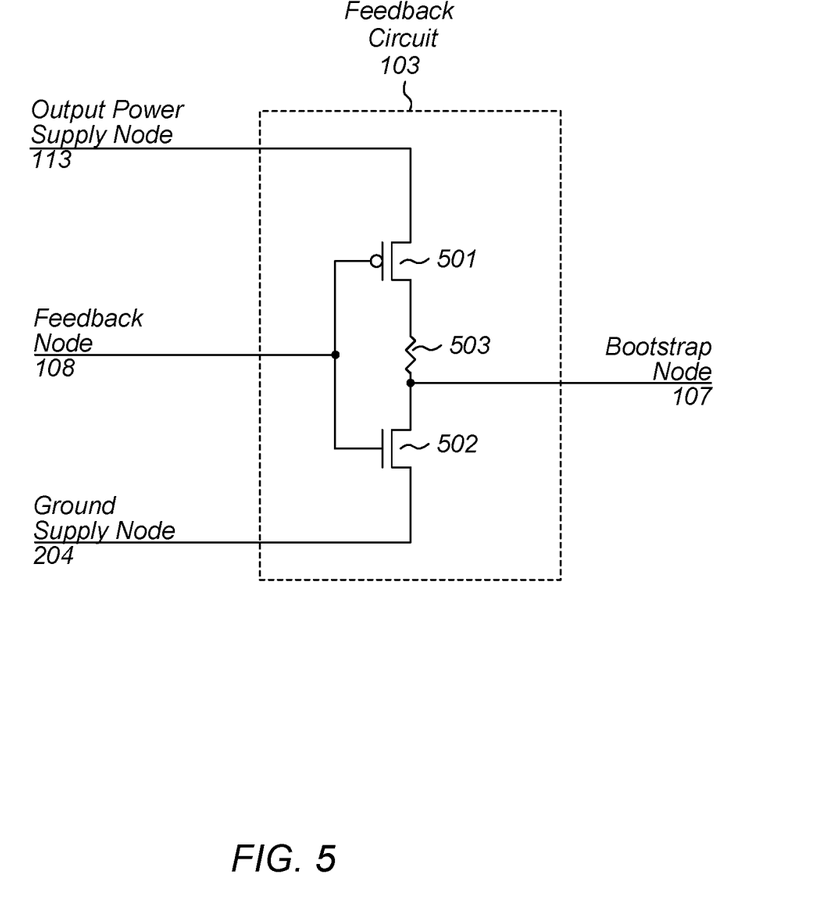
FIG. 5 is a block diagram of a feedback circuit.

Turning to FIG. 5, an embodiment of feedback circuit 103 is depicted. As illustrated, feedback circuit 103 includes devices 501 and 502, and resistor 503. Device 501 is coupled between output power supply node 113 and resistor 503, which is, in turn, coupled to bootstrap node 107. Device 502 is coupled between bootstrap node 107 and ground supply node 204.

In various embodiments, device 501 may be a particular embodiment of a p-channel MOSFET that is controlled, at least in part, by a voltage level of feedback node 108. In some cases, when the voltage level of feedback node 108 is below a voltage level of output power supply node 113 by a threshold level, device 501 may allow current to from output power supply node 133 to bootstrap node 107 via resistor 503.

Resistor 503 may, in various embodiments, be a particular embodiment of a metal resistor, a polysilicon resistor, or any other suitable resistor type. In some embodiments, resistor 503 creates increases the impedance between device 501 and bootstrap node 107 when there is a low-going transition on input signal 110. By increasing the impedance between device 501 and bootstrap node 107, the effect of bootstrap circuit 104 in responding to the low-going transition on input signal 110 is enhanced, helping to activate device 201 in input circuit 101. In some cases, a value of resistor 503 may be selected such that a time constant formed by the capacitance of bootstrap node 107 and resistor 503 is less than half-cycle of operation of level shifter circuit 100.

Device 502 may, in some cases, be a particular embodiment of an n-channel MOSFET that is controlled, at least in part, by the voltage level of feedback node 108. For example, when the voltage level of feedback node 108 is greater than the voltage level of ground supply node 204, device 502 may allow current to flow from bootstrap node 107 into ground supply node 204, thereby discharging bootstrap node 107.

Figure 6:
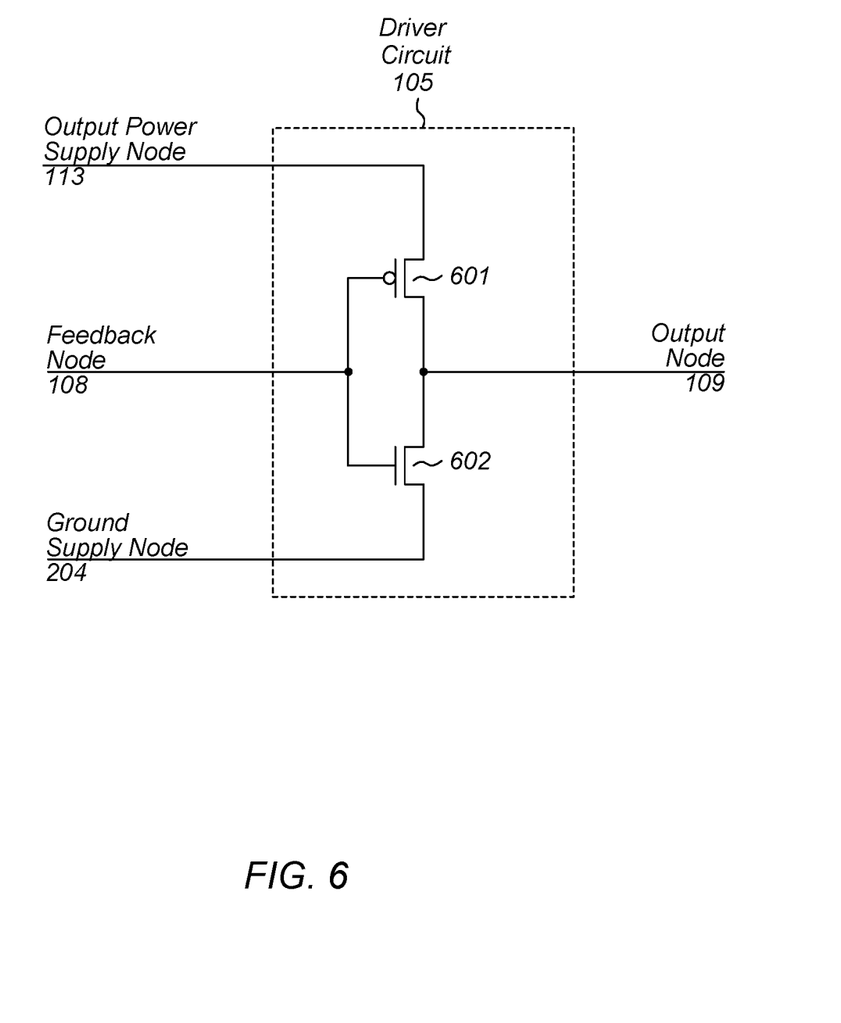
FIG. 6 is a block diagram of a driver circuit.

Turning to FIG. 6, an embodiment of driver circuit 105 is depicted. As illustrated, driver circuit 105 includes devices 601 and 602. Device 601 is coupled between output power supply node 113 and output node 109. Device 601 is coupled between output node 109 and ground supply node 204.

In various embodiments, device 601 may be a particular embodiment of a p-channel MOSFET that is controlled, at least in part, by a voltage level of feedback node 108. In some cases, when the voltage level of feedback node 108 is below a voltage level of output power supply node 113 by a threshold level, device 601 may allow current to from output power supply node 133 to output node 109.

Device 602 may, in some cases, be a particular embodiment of an n-channel MOSFET that is controlled, at least in part, by the voltage level of feedback node 108. For example, when the voltage level of feedback node 108 is greater than the voltage level of ground supply node 204, device 602 may allow current to flow from output node 109 into ground supply node 204, thereby discharging output node 109.

Figure 7:
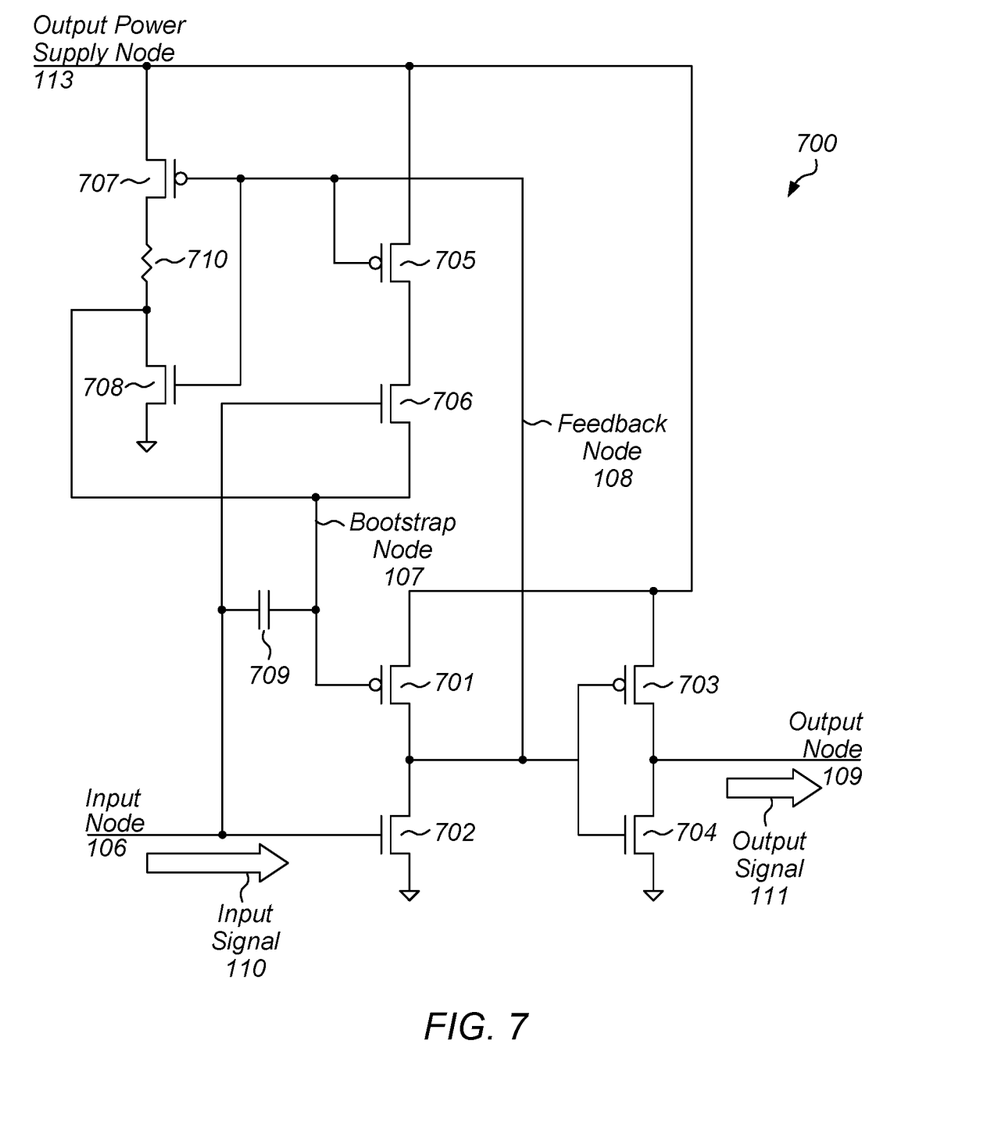
FIG. 7 is a schematic diagram of an embodiment of a level shifter circuit.

Turning to FIG. 7, a schematic diagram of a particular embodiment of a level shifter circuit is depicted. As illustrated, level shifter circuit 700 includes devices 701-708, capacitor 709, and resistor 710. In various embodiments, level shifter circuit 700 may correspond to level shifter circuit 100 as illustrated in FIG. 1.

In various embodiments, 701 and 702 may correspond to devices 201 and 202 of input circuit 101 and be configured to receive input signal 110 generated using a voltage level of input power supply node 112. The combination of devices 701 and 702 is also configured to discharge feedback node 108 in response to a high-going transition of input signal 110.

Capacitor 709 may, in some embodiments, correspond to capacitor 301 of bootstrap circuit 104. In various embodiments, capacitor 709 is configured to increase a voltage level of bootstrap node 107 in response to the high-going transition of input signal 110.

In some embodiments, devices 707 and 708 may correspond to devices 501 and 502, respectively, of feedback circuit 103, and resistor 710 may correspond to resistor 503 of feedback circuit 103. The combination of devices 707 and 708, and resistor 710 is configured to charge bootstrap node to a voltage level of output power supply node 113 in response to a discharge of feedback node 108.

In some cases, devices 705 and 706 may correspond to devices 401 and 402, respectively of transient assist circuit 102. The combination of devices 705 and 706 is configured to source a current to bootstrap node 107 in response to the discharge of the feedback node 108. Additionally, the combination of devices 705 and 706 is also configured to halt sourcing current to bootstrap node 107 in response to a low-going transition on input signal 110.

Devices 703 and 704 may, in some embodiments, correspond to devices 601 and 602, respectively, of driver circuit 105. The combination of devices 703 and 704 is configured to generate output signal 111 using the voltage level of output power supply node 113 and the voltage level of feedback node 108. In various embodiments, the combination of devices 703 and 704 may selectively charge or discharge output node 109 based on the voltage level of feedback node 108 in order to generate output signal 111.

It is noted that the devices 701, 703, 705 and 707 may be particular embodiments of p-channel MOSFETs, and that devices 702, 704, 706, and 708 may be particular embodiments of n-channel MOSFETs. Although MOSFETs are depicted in the embodiment illustrated in FIG. 7, in other embodiments, any suitable type of transconductance devices may be employed.

When input signal 110 is a high logic level for the voltage domain corresponding to input power supply node 112, device 702 activates, discharging feedback node 108 to ground. The discharge of feedback node 108 to ground, activates device 703, transitioning output signal 111 to a high logic level corresponding to output power supply node 113.

The high logic level on input signal 110 also activates device 706. The transition of input signal 110 from a low logic level to high logic level couples into bootstrap node 107 via capacitor 709, thereby increasing the voltage of bootstrap node 107, which begins to turn off device 701. In various embodiments, a value of capacitor 709 may be selected based on the capacitance associated with bootstrap node 107. For example, in some cases the value of capacitor 709 may be three to five times that of the capacitance of bootstrap node 107.

The low voltage on feedback node 108 resulting from it being discharged by device 702, activates device 705. Since device 706 is already activated, current flows from output power supply node 113 to bootstrap node 107, thereby charging bootstrap node 107 to a voltage level of output power supply node 113 to further deactivate device 701 and reduce dynamic current through device 701 until bootstrap node is fully charged the voltage level of output power supply 113.

The low voltage on feedback node 108 also deactivates device 708, while activating device 707, providing a conduction path from output power supply node 113 to bootstrap node 107 via resistor 710. The conduction path from output power supply node 113 to bootstrap node 107 allow bootstrap node 107 to charge to the voltage level of output power supply node 113.

When input signal 110 transitions from a high logic level to a low logic level, the low voltage level of input signal 110 deactivates devices 702 and 706. With device 706 deactivated, resistor 710 provides a high impedance on bootstrap node 107. The low going transition of input signal 110 couples into bootstrap node 107 via capacitor 709, thereby decreasing the voltage level on bootstrap node 107. As the voltage level of bootstrap node 107 decreases, device 701 begins to activate, charging feedback node 108.

As the voltage of feedback node 108 increases, device 708 begins to activate, which begins to discharge bootstrap node 107. With the device 708 discharging bootstrap node 107, the voltage level of bootstrap node 107 further decrease, which, in turn, further activates device 701. The process continues until bootstrap node 107 is discharged to a voltage level that is within a threshold value of ground potential.

Structures, such as those shown in FIGS. 2-6, for level shifting a signal may be referred to using functional language. In some embodiments, these structures may be described as including "a means receiving an input signal generated using a first power supply signal," "a means for discharging a feedback node in response to a high-going transition of the input signal," "a means for increasing a voltage level of a bootstrap node in response to the high-doing transition of the input signal," "a means for charging the bootstrap node to a voltage level of a second power supply in response to a discharge of the feedback node," and "a means for generating an output signal using the second power supply signal and the voltage level of the feedback node."

The corresponding structure for "means for receiving an input signal generated using a first power supply signal" and "means for discharging a feedback node in response to a high-going transition of the input signal" is devices 201 and 202, as well as their equivalents. The corresponding structure for "means for increasing a voltage level of a bootstrap node in response to the high-going transition of the input signal" is capacitor 301 and its equivalents. Devices 501 and 502, and resistor 503, as well as their equivalents, are the corresponding structure for "means for charging the bootstrap node to a voltage level of a second power supply signal in response to discharge of the feedback node." The corresponding structure for "means for generating an output signal using the second power supply signal and the voltage level of the feedback node" is devices 601 and 602, as well as their equivalents.

Figure 8:
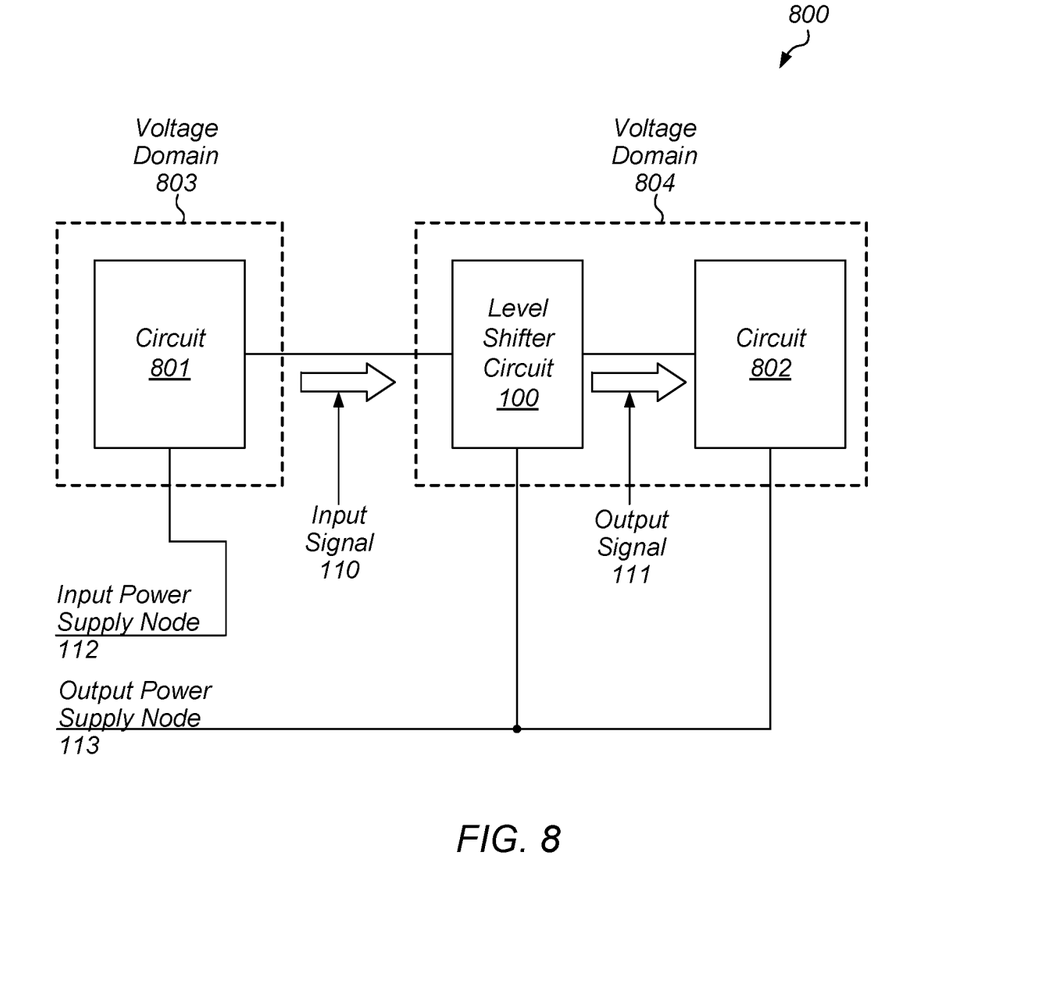
FIG. 8 is a block diagram of a portion of a computer system.

Level shifter circuit 100 may be used in a variety of situations. An example of a portion of a computer system employing level shifter circuit 100 is depicted in FIG. 8. As illustrated, computer system portion 800 includes circuit 801, level shifter circuit 100, and circuit 802.

Circuit 801 is included in voltage domain 803 and is coupled to input power supply node 112, while level shifter circuit 100 and circuit 802 are included in voltage domain 804 and each coupled to output power supply node 113. In various embodiments, voltage levels of input power supply node 112 and output power supply node 113 may be different.

Circuit 801 is configured to generate input signal 110 using input power supply node 112. In various embodiments, circuit 801 may be a processor circuit, a memory circuit, or any suitable type of circuit employed in computer system portion 800. Input signal 110 may encode data using two different voltage levels. For example, when the voltage level of input signal 110 is within a threshold value of ground potential, a logic 0 value may be encoded. Additionally, when the voltage level of input signal 110 is within a threshold value of the voltage level of input power supply node 112, a logic 1 value may be encoded.

As described above, level shifter circuit 100 generates output signal 111 using input signal 110 and the voltage level of output power supply node 113. In various embodiments, output signal 111 data may be encoded in output signal 111 using two voltage levels. For example, when the voltage level of output signal 111 is within a threshold value of ground potential, a logic 0 value may be encoded, while when the voltage level of output signal 111 is within a threshold value of the voltage level of output power supply node 113, a logic 1 value may be encoded. By creating output signal 111 using the voltage level of output power supply node 113, level shifter circuit 100 provides a signal to circuit 802 that can be directly used by circuit 802.

Circuit 802 is configured to receive output signal 111. In various embodiments, circuit 802 may be a processor circuit, a memory circuit, or any other suitable type of circuit employed in computer system portion 800. It is noted that although output signal 111 is shown being consumed by a single circuit block, in other embodiments, output signal 111 may be consumed by any suitable number of blocks.

Figure 9:
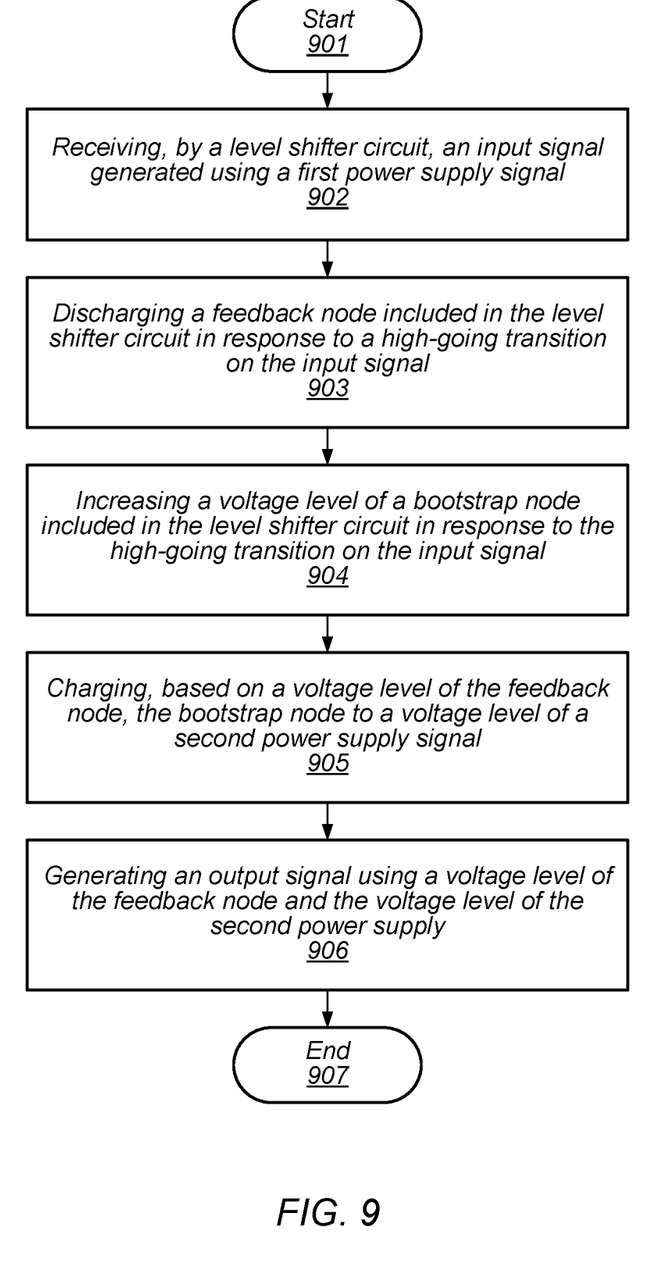
FIG. 9 is a flow diagram of an embodiment of a method for operating a level shifter circuit.

Turning to FIG. 9, a flow diagram depicting an embodiment of a method for operating a sensor circuit level shifter is illustrated. The method, which begins in block 901, may be applied to level shifter circuit 100 or any other suitable level shifter circuit.

The method includes, receiving, by a level shifter circuit, an input signal generated using a first power supply signal (block 902). In various embodiments, a circuit block included in a first power domain different from a second power domain, which includes the level shifter circuit, may generate the input signal.

The method also includes, discharging a feedback node included in the level shifter circuit, in response to a high-going transition on the input signal (block 903). In some embodiments, the method may include halting said discharging of the feedback node in response to a low-going transition of the input signal.

The method further includes, increasing a voltage level of a bootstrap node included in the level shifter circuit, in response to the high-going transition on the input signal (block 904). In some embodiments, the method may also include sourcing a current to the bootstrap node using the voltage level of the feedback node and a voltage level of the input signal.

The method also includes, charging, based on a voltage level of the feedback node, the bootstrap node to a voltage level of a second power supply signal (block 905). The method may, in some embodiments and in response to a low-going transition on the input signal, further include decreasing the voltage level of the bootstrap node. In various embodiments, the method may also include discharging, based on the voltage level of the feedback node, the bootstrap node.

The method further includes, generating an output signal using the voltage level of the feedback node and the voltage level of the second power supply signal (block 906). In some cases, generating the output signal may include selectively sourcing or sinking current to an output node using the voltage level of the feedback node. The method concludes in block 907.

Figure 10:
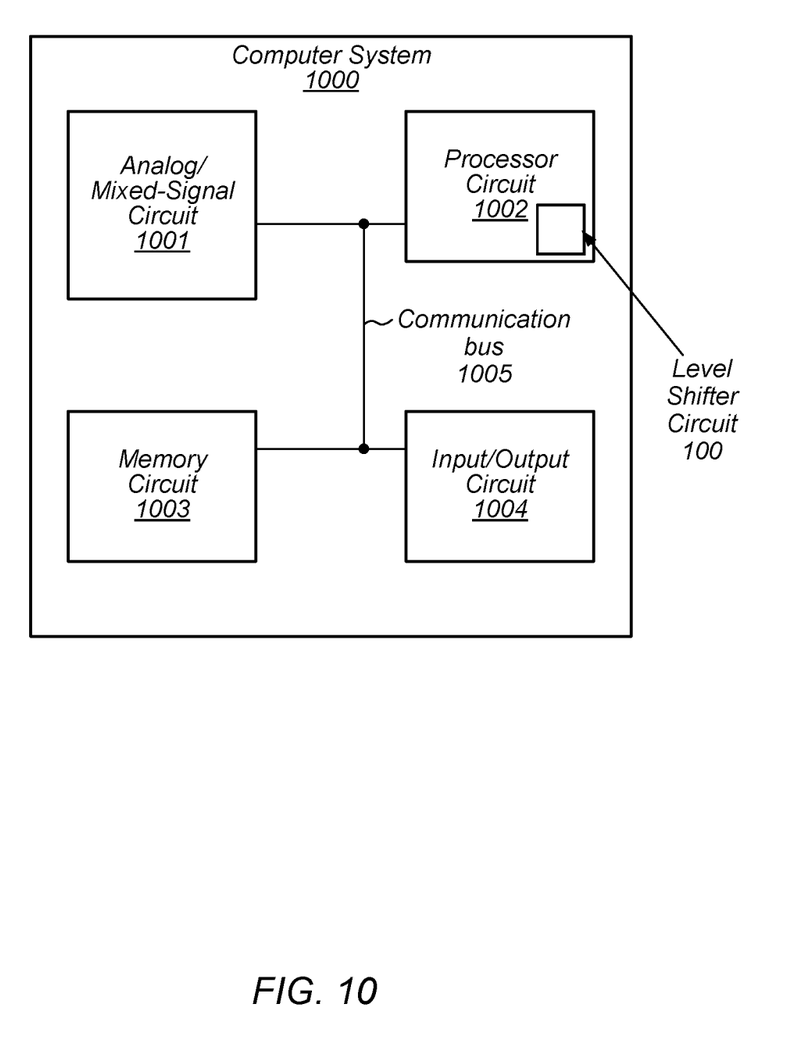
FIG. 10 is a block diagram of a computer system.

A block diagram of computer system is illustrated in FIG. 10. As illustrated embodiment, the computer system 1000 includes analog/mixed-signal circuits 1001, processor circuit 1002, memory circuit 1003, and input/output circuits 1004, each of which is coupled to communication bus 1005. In various embodiments, computer system 1000 may be a system-on-a-chip (SoC) and be configured for use in a desktop computer, server, or in a mobile computing application such as, a tablet, laptop computer, or wearable computing device.

Analog/mixed-signal circuits 1001 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 1001 may be configured to perform power management tasks with the inclusion of on-chip power supplies and voltage regulators.

In various embodiments, processor circuit 1002, which includes level shifter circuit 100, may be representative of a general-purpose processor that performs computational operations. For example, processor circuit 1002 may be a central processing unit (CPU) such as a microprocessor, a microcontroller, an application-specific integrated circuit (ASIC), or a field-programmable gate array (FPGA).

Memory circuit 1003 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that in the embodiment of a computer system in FIG. 10, a single memory circuit is depicted. In other embodiments, any suitable number of memory circuits may be employed.

Input/output circuits 1004 may be configured to coordinate data transfer between computer system 1000 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1004 may be configured to implement a version of Universal Serial Bus (USB) protocol or IEEE 1394 (Firewire®) protocol.

Input/output circuits 1004 may also be configured to coordinate data transfer between computer system 1000 and one or more devices (e.g., other computing systems or integrated circuits) coupled to computer system 1000 via a network. In one embodiment, input/output circuits 1004 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1004 may be configured to implement multiple discrete network interface ports.

Figure 11:
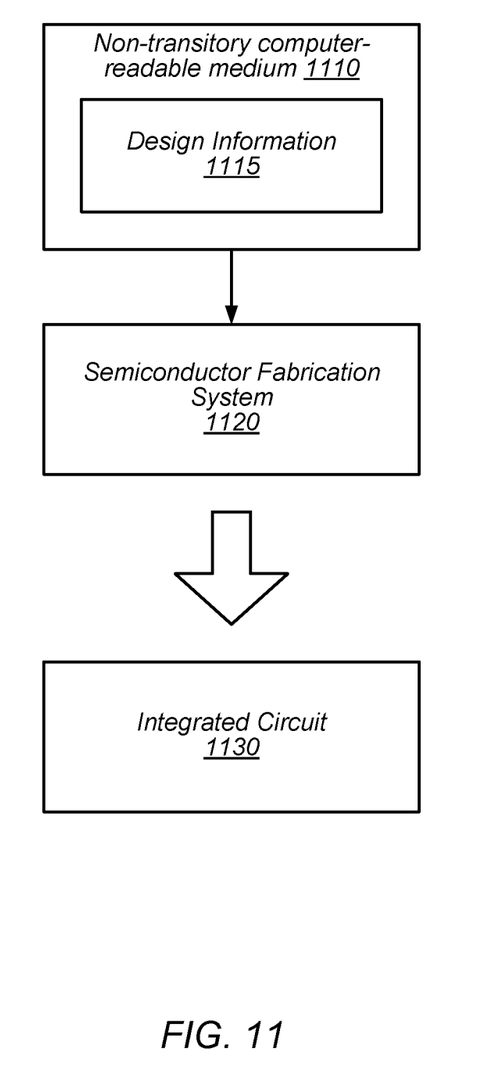
FIG. 11 illustrates an example non-transitory computer-readable storage medium that stores circuit design information.

FIG. 11 is a block diagram illustrating an example non-transitory computer-readable storage medium that stores circuit design information, according to some embodiments. In the illustrated embodiment, semiconductor fabrication system 1120 is configured to process the design information 1115 stored on non-transitory computer-readable storage medium 1110 and fabricate integrated circuit 1130 based on the design information 1115.

Non-transitory computer-readable storage medium 1110, may comprise any of various appropriate types of memory devices or storage devices. Non-transitory computer-readable storage medium 1010 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1110 may include other types of non-transitory memory as well or combinations thereof. Non-transitory computer-readable storage medium 1110 may include two or more memory mediums, which may reside in different locations, e.g., in different computer systems that are connected over a network.

Design information 1115 may be specified using any of various appropriate computer languages, including hardware description languages such as, without limitation: VHDL, Verilog, SystemC, SystemVerilog, RHDL, M, MyHDL, etc. Design information 1115 may be usable by semiconductor fabrication system 1120 to fabricate at least a portion of integrated circuit 1030. The format of design information 1115 may be recognized by at least one semiconductor fabrication system, such as semiconductor fabrication system 1120, for example. In some embodiments, design information 1115 may include a netlist that specifies elements of a cell library, as well as their connectivity. One or more cell libraries used during logic synthesis of circuits included in integrated circuit 1130 may also be included in design information 1115. Such cell libraries may include information indicative of device or transistor level netlists, mask design data, characterization data, and the like, of cells included in the cell library.

Integrated circuit 1130 may, in various embodiments, include one or more custom macrocells, such as memories, analog or mixed-signal circuits, and the like. In such cases, design information 1115 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1120 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1120 may also be configured to perform various testing of fabricated circuits for correct operation.

In various embodiments, integrated circuit 1130 is configured to operate according to a circuit design specified by design information 1115, which may include performing any of the functionality described herein. For example, integrated circuit 1130 may include any of various elements shown or described herein. Further, integrated circuit 1130 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an input circuit configured to:
        receive an input signal generated using a first power supply signal; and
        discharge a feedback node in response to a high-going transition of the input signal;
    a bootstrap circuit configured to increase a voltage level of a bootstrap node in response to the high-going transition of the input signal;
    a transient assist circuit configured to source a current to the bootstrap node in response to the discharge of the feedback node;
    a feedback circuit configured to charge the bootstrap node to a voltage level of a second power supply signal in response to a discharge of the feedback node, wherein a voltage level of the second power supply signal is different than a voltage level of the first power supply signal; and
    a driver circuit configured to generate an output signal using the second power supply signal and the voltage level of the feedback node.

2. The apparatus of claim 1, wherein the input circuit is further configured to halt discharging the feedback node in response to a low-going transition of the input signal.

3. The apparatus of claim 2, wherein the bootstrap circuit is further configured to decrease the voltage level of the bootstrap node in response to the low-going transition of the input signal.

4. The apparatus of claim 1, wherein the feedback circuit is further configured to discharge the bootstrap node using the voltage level of the feedback node.

5. The apparatus of claim 1, wherein the feedback circuit includes:
- a first device coupled to the second power supply signal, wherein the first device is controlled, at least in part, by the voltage level of the feedback node;
- a second device coupled between the bootstrap node and a ground supply, wherein the second device is controlled, at least in part, by the voltage level of the feedback node; and
- a resistor coupled between the bootstrap node and the first device.

6. A method, comprising:
- receiving, by a level shifter circuit, an input signal generated using a first power supply signal;
- discharging a feedback node included in the level shifter circuit, in response to a high-going transition on the input signal;
- increasing a voltage level of a bootstrap node included in the level shifter circuit, in response to the high-going transition on the input signal;
- sourcing, in response to discharging the feedback node, a current to the bootstrap node using a voltage level of the input signal;
- charging, based on a voltage level of the feedback node, the bootstrap node to a voltage level of a second power supply signal, wherein a voltage level of the second power supply signal is different than a voltage level of the first power supply signal; and
- generating an output signal using the voltage level of the feedback node and the voltage level of the second power supply signal.

7. The method of claim 6, further comprising halting said discharging of the feedback node in response to a low-going transition of the input signal.

8. The method of claim 7, further comprising, decreasing a voltage level of the bootstrap node in response to the low-going transition of the input signal.

9. The method of claim 8, wherein decreasing the voltage level of the bootstrap node include coupling the low-going transition of the input signal to the bootstrap node.

10. The method of claim 6, further comprising discharging, based on the voltage level of the feedback node, the bootstrap node.

11. The method of claim 6, wherein generating the output signal includes selectively sourcing or sinking current to an output node using the voltage level of the feedback node.

12. An apparatus, comprising:
- a first circuit configured to generate a first signal using a first power supply signal; and
- a second circuit coupled to a second power supply signal, wherein a first voltage level of the first power supply signal is different than a second voltage level of the second power supply signal, and wherein the second circuit includes a feedback node and a bootstrap node and is configured to:
- discharge the feedback node in response to a high-going transition of the first signal;
- increase a voltage level of the bootstrap node in response to the high-going transition of the first signal;
- source, in response to a discharge of the feedback node, a current to the bootstrap node via a resistor coupled to the bootstrap node to charge the bootstrap node to the second voltage level; and
- generate a second signal using the second voltage level and a voltage level of the feedback node.

13. The apparatus of claim 12, wherein to source the current to the bootstrap node, the second circuit is further configured to source the current to the bootstrap node using the voltage level of the feedback node and a voltage level of the first signal.

14. The apparatus of claim 12, wherein the second circuit is further configured to halt discharging the feedback node in response to a low-going transition of the first signal.

15. The apparatus of claim 14, wherein the second circuit is further configured to decrease the voltage level of the bootstrap node in response to the low-going transition of the first signal.

16. The apparatus of claim 15, wherein to decrease the voltage level of the bootstrap node, the second circuit is further configured to couple the low-going transition of the first signal to the bootstrap node.

17. The apparatus of claim 12, wherein the second circuit is further configured to discharge the bootstrap node using the voltage level of the feedback node.

\* \* \* \* \*